(12) United States Patent
Dai et al.

(10) Patent No.: US 10,454,269 B2
(45) Date of Patent: Oct. 22, 2019

(54) DYNAMICALLY TRIGGERED ELECTROSTATIC DISCHARGE CELL

(71) Applicant: Texas Instruments Incorporated, Dallas, TX (US)

(72) Inventors: Xianzhi Dai, Shanghai (CN); Antonio Gallerano, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/581,173

(22) Filed: Apr. 28, 2017

(65) Prior Publication Data

US 2018/0182749 A1   Jun. 28, 2018

(30) Foreign Application Priority Data

Dec. 26, 2016   (WO) ................ PCT/CN2016/112088

(51) Int. Cl.
*H02H 9/04*   (2006.01)
*H01L 27/02*   (2006.01)

(52) U.S. Cl.
CPC ......... *H02H 9/046* (2013.01); *H01L 27/0285* (2013.01)

(58) Field of Classification Search
CPC .. H01L 27/0274; H01L 29/1095; H02H 9/046
USPC ........................................................ 361/56
See application file for complete search history.

(56) References Cited

U.S. PATENT DOCUMENTS

| 5,311,391 | A | * | 5/1994 | Dungan | ................ | H02H 9/046 |
| | | | | | | 361/56 |
| 5,932,918 | A | | 8/1999 | Krakauer et al. | | |
| 7,196,890 | B2 | * | 3/2007 | Smith | ................ | H01L 27/0285 |
| | | | | | | 361/111 |
| 7,876,540 | B2 | * | 1/2011 | Deval | ................ | H01L 27/0266 |
| | | | | | | 361/56 |
| 2002/0122280 | A1 | | 9/2002 | Ker et al. | | |
| 2002/0181177 | A1 | | 12/2002 | Ker et al. | | |

FOREIGN PATENT DOCUMENTS

| CN | 1234612 A | 11/1999 |
| CN | 1763945 A | 4/2006 |
| CN | 103715672 A | 4/2014 |

OTHER PUBLICATIONS

International Search Report (State Intellectual Property Office of the P.R. China), dated Sep. 27, 2017, PCT/CN2016/112088.

* cited by examiner

*Primary Examiner* — Kevin J Comber
(74) *Attorney, Agent, or Firm* — Rose Alyssa Keagy; Charles A. Brill; Frank D. Cimino

(57) ABSTRACT

An electrostatic discharge (ESD) protection circuit includes an active shunt transistor, a first pull-down transistor, and a second pull-down transistor. The active shunt transistor is coupled between a first I/O pad and a reference voltage. The first pull-down transistor is connected to the reference voltage. The second pull-down transistor is connected to the first pull-down transistor and the first I/O pad. The first pull-down transistor and the second pull-down transistor are in separate isolation tanks of an isolation deep n-well.

20 Claims, 2 Drawing Sheets

DYNAMICALLY TRIGGERED ELECTROSTATIC DISCHARGE CELL

BACKGROUND

Modern high-density integrated circuits (ICs) are known to be vulnerable to damage from the electrostatic discharge (ESD) from a charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or during runtime of the system in which the IC is installed. Some ESD protection schemes use active clamp circuits to shunt ESD current between an input/output (I/O) and ground pad and thereby protect internal IC element nodes that are connected to bond pads from ESD damage. An active clamp circuit may include a Metal Oxide Semiconductor Field Effect Transistor (MOSFET) coupled between the I/O and ground pad. This MOSFET is relatively large and often occupies 60% or more of total area of the ESD protection circuit. Each of the IC's pins generally includes its own ESD protection circuit with its own large MOSFET.

SUMMARY

In accordance with some embodiments, systems and methods of providing ESD protection are provided. In some embodiments, an electrostatic discharge (ESD) protection circuit includes an active shunt transistor, a first pull-down transistor, and a second pull-down transistor. The active shunt transistor is coupled between a first I/O pad and a reference voltage. The source of the first pull-down transistor is connected to the reference voltage. The gate of the second pull-down transistor is connected to the gate of the first pull-down transistor. The drain of the second pull-down transistor is connected to the first I/O pad. The first pull-down transistor and the second pull-down transistor are in separate isolation tanks of an isolation deep n-well.

Another illustrative embodiment is an integrated circuit that includes a first I/O pad, a second I/O pad, and an ESD protection circuit coupled to the first and second I/O pads. The first and second I/O pads are connected to host logic and provide input and output connections for the host logic. The ESD protection circuit includes an active shunt transistor, a first pull-down transistor, and a second pull-down transistor. The active shunt transistor is coupled between the first I/O pad and a reference voltage. The first pull-down transistor is connected to the reference voltage. The second pull-down transistor is connected to the first pull-down transistor and the first I/O pad. The first pull-down transistor and the second pull-down transistor are in separate isolation tanks of an isolation deep n-well.

Yet another illustrative embodiment is an ESD protection circuit that includes an active shunt transistor, a first pull-down transistor, and a second pull-down transistor. The active shunt transistor is coupled between a first I/O pad and a reference voltage. The first pull-down transistor is connected to the reference voltage. The second pull-down transistor is connected to the first pull-down transistor and the first I/O pad. The first pull-down transistor and the second pull-down transistor are in separate isolation tanks of an isolation deep n-well.

BRIEF DESCRIPTION OF THE DRAWINGS

For a detailed description of various examples, reference will now be made to the accompanying drawings in which.

NOTATION AND NOMENCLATURE

Figure 1:
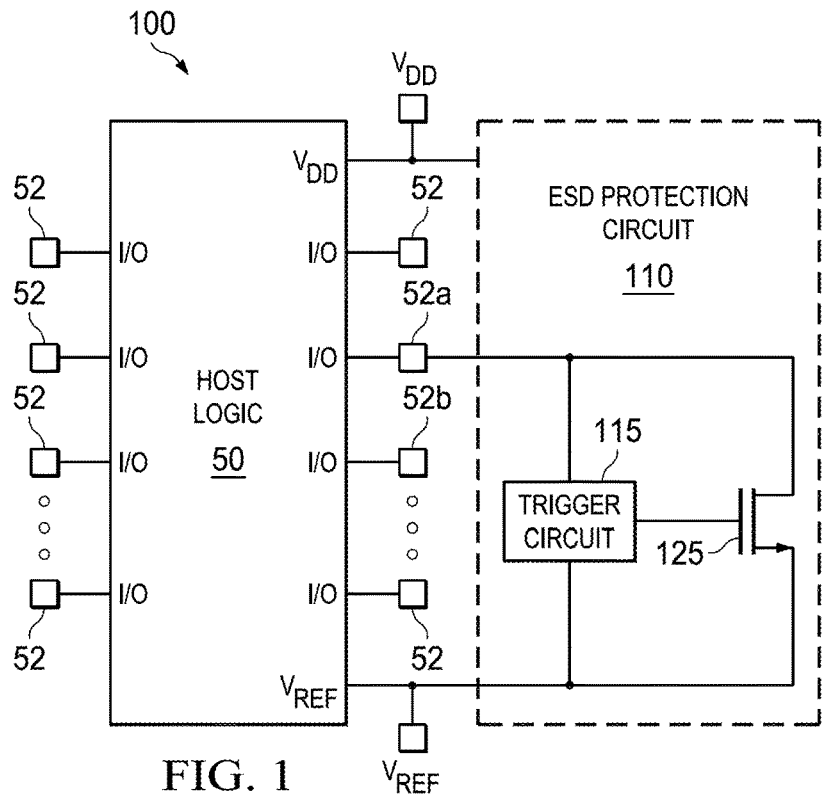
FIG. 1 shows an illustrative schematic diagram of an ESD-protected integrated circuit including a triggering circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Conventional isolated type dynamically triggered MOSFET ESD protection circuits are designed to shunt ESD current between the input/output (I/O) and ground pads and thereby protect internal IC element nodes that are connected to bond pads from ESD damage if an ESD stress event occurs on a bond pad. In the conventional ESD protection circuit, a single pull-down transistor drives the gate of a triggering transistor LOW during normal operations. However, during an ESD stress event, a boot capacitor drives the gate of the triggering transistor HIGH which provides a trigger for an active shunt transistor to shunt the ESD current between the I/O and ground pads. All of the components of the conventional ESD protection circuit are constructed in a single isolation tank of a deep n-well. However, if the deep n-well is connected to another pad, during an ESD stress event on the I/O pad, a parasitic NPN transistor forms that discharges the gate of the triggering transistor, thus causing the trigger voltage of the active shunt transistor to considerably increase. Thus, the active shunt transistor may not clamp at a low-level voltage if an ESD stress event occurs. Therefore, it is desirable to design an ESD protection circuit that operates to shunt current between the I/O and ground pads during an ESD stress event even if the deep n-well in which the ESD protection circuit is constructed is connected to another pad.

In accordance with the disclosed principles, an ESD protection circuit includes a boot capacitor, two pull-down transistors, a triggering transistor, and an active shunt transistor. The two pull-down transistors are configured to generate a LOW gate drive signal to the triggering transistor during normal operations. During an ESD stress event, the boot capacitor drives the gate of the triggering transistor HIGH providing the trigger for the active shunt transistor to turn ON and shunt the ESD current between the I/O and ground pads. One of the two pull-down transistors is in a separate isolation tank in the deep n-well from the remaining components of the ESD protection circuit. Thus, while parasitic NPN transistors are formed for each of the pull-down transistors during an ESD stress event, because one of the pull-down transistors is in a separated isolation tank from the other pull-down transistor, the triggering transistor, and the active shunt transistor, the base of the parasitic NPN formed for the separately isolated pull-down transistor will not charge easily preventing the second parasitic NPN from discharging the gate of the triggering transistor. Thus, the active shunt transistor will continue to maintain the same trigger voltage for shunting current between the I/O and ground pads during an ESD stress event even if the deep n-well is connected to another pad.

FIG. 1 is an illustrative schematic diagram of an ESD-protected integrated circuit 100. The integrated circuit 100 includes host logic 50 which includes at least one, and generally multiple I/O pads 52. The I/O pads 52 provide the host logic 50 of the integrated circuit 100 with input/output connectivity to other integrated circuits and devices. An ESD protection circuit 110 is provided for at least one and, in some implementations, all I/O pads 52. In some embodiments, the ESD protection circuit 110 may be formed in an isolation tank formed by a deep n-well. For example, the ESD protection circuit 110 may be constructed on a p-type substrate that is completely enclosed by a deep n-type well (deep n-well) and is isolated from other circuits or components.

An example of one of the ESD protection circuits 110 is illustrated for the I/O pads designated as I/O pad 52a, and the remaining ESD protection circuits for the other I/O pads 52 are not shown in FIG. 1 for simplicity. In some embodiments, a second I/O pad, shown as I/O pad 52b and/or a supply pad, may be connected to the same isolation deep n-well as the I/O pad 52b. Therefore, the deep n-well where the ESD protection circuit 110 is constructed may be connected to more than a single I/O pad.

The host logic 50 is connected by a VDD pad to VDD and by a VREF pad to a reference voltage (VREF) (i.e., ground that is chip substrate, ground that is not the chip substrate, VSS, etc.) and includes multiple I/O pads 52 by which the host logic 50 carries out its function. Host logic 50 receives signals from and transmits signals to the various I/O pads 52. The host logic 50 realizes and caries out desired functionality of ESD-protected integrated circuit 100. Examples of such host logic functionality include a digital integrated circuit such as a digital signal processor or microcontroller, an analog integrated circuit such as an amplifier or power converter, etc. The capability of the host logic 50 provided by the ESD-protected integrated circuit 100 may vary, for example, ranging from a simple device to a complex device.

The ESD protection circuit 110 includes a trigger circuit 115 and an active shunt transistor 125. The active shunt transistor 125 connects between I/O and VREF. The trigger circuit 115 drives the gate of the active shunt transistor 125 in response to an elevated voltage on the I/O pad 52a resulting from an ESD stress event on the I/O pad. The ESD protection circuit 110 may also provide ESD protection for the VDD pad.

The components of the ESD-protected integrated circuit 100 shown in FIG. 1 are formed on a substrate. In some implementations, the substrate may comprise silicon, silicon-germanium, or other semiconductor material. In one example, the substrate is a p− epi on a p+ substrate. Another particular arrangement is a silicon/germanium (SiGe) semiconductor surface on a silicon substrate.

In operation, an ESD stress event on I/O pad 52a creates a fast rising voltage (with respect to VREF). In turn, the trigger circuit 115 responds by asserting the gate of the active shunt transistor 125. Once ON, the active shunt transistor 125 effectively shorts I/O to VREF thereby permitting a current path from I/O to VREF. The current path through the active shunt transistor 125 during an ESD stress event enables the ESD-based current to shunt directly to ground through the active shunt transistor 125 rather than through the host logic 50, which otherwise might damage the host logic. Thus, with the active shunt transistor 125 ON during an ESD stress event on the I/O pad 52a, current is conducted from the I/O pad through the active shunt transistor 125 to VREF.

Figure 2:
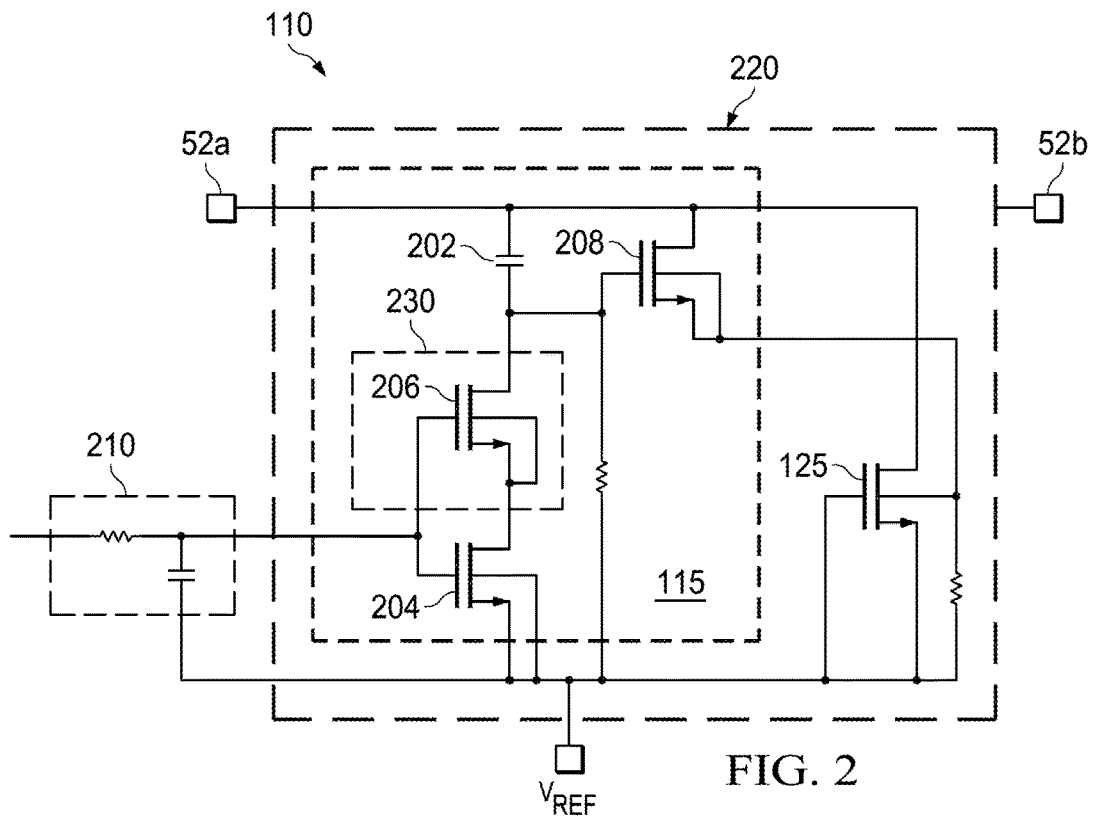
FIG. 2 shows an illustrative circuit diagram of an ESD protection circuit which provides ESD protection for an input/output (I/O) pad in accordance with various embodiments.

FIG. 2 shows an illustrative circuit diagram of ESD protection circuit 110 which provides ESD protection for I/O pad 52a in accordance with various embodiments. As discussed above, ESD protection circuit 110 may include trigger circuit 115 and active shunt transistor 125. The ESD protection circuit 110 may be constructed in deep n-well 220 which in addition to being connected to I/O pad 52a may be connected to I/O pad 52b or a VDD pad. Thus, ESD protection circuit 110 may be constructed on a p-type substrate which is completely enclosed by deep n-type (i.e., a larger electron concentration than hole concentration semiconductor) isolation well. The trigger circuit 115 may include boot capacitor 202, pull-down transistor 204, pull-down transistor 206, and triggering transistor 208. In some embodiments, the pull-down transistors 204-206, triggering transistor 208, and active shunt transistor 125 are n-type metal oxide semiconductor (NMOS) transistors. While the pull-down transistors 204-206 are constructed in the same deep n-well, in some embodiments, pull-down transistor 206 is constructed in a separate isolation tank as the pull-down transistor 204.

Pull-down transistors 204-206 may be configured to disable the trigger from turning ON the active shunt transistor 125 during normal operation (i.e., no ESD stress event on I/O pad 52a). In other words, the pull-down transistors 204-206 act to "pull-down" their output voltage to VREF which turns the triggering transistor 208 OFF during normal operation. The drain of pull-down transistor 206 is connected to the boot capacitor 202 and to the gate of the triggering transistor 208. The body of the pull-down transistor 206 is connected to the source of pull-down transistor 206 which are both connected to the drain of pull-down transistor 204. The body and source of pull-down transistor 204 are both connected to VREF. The gate of both the pull-down transistors 204-206 are connected to an internal signal through an RC filter 210. Thus, in normal operation (i.e., no ESD stress event on I/O pad 52a), the internal signal will drive the gates of the pull-down transistors 204-206 HIGH turning them ON. Therefore, the output of the pull-down transistors 204-206 at the drain of pull-down transistor 206 is at VREF. This, in turn, drives the gate of triggering transistor 208 LOW. Hence, the triggering transistor 208 is OFF during normal operation.

However, in the event of an ESD stress event on the I/O pad 52a, the RC filter 210, which will maintain the potential of VREF, will drive the gates of the pull-down transistors 204-206 LOW turning them OFF. Boot capacitor 202 is connected to the drain of pull-down transistor 206, the gate of triggering transistor 208, and I/O pad 52a. Boot capacitor 202 is configured to pull-up the gate of the triggering transistor 208, in some embodiments above the level of VREF, during an ESD stress event in the I/O pad 52a. In other words, boot capacitor 202 is configured to generate a bootstrap voltage to provide the gate drive voltage for turning ON triggering transistor 208 once an ESD stress event occurs on the I/O pad 52a.

In the embodiment shown in FIG. 2, the gate of triggering transistor 208 is connected to the boot capacitor 202, the drain of pull-down transistor 206, and VREF, in some embodiments, through a resistor. The drain of triggering transistor 208 is connected the I/O pad 52a. The body of triggering transistor 208 is connected to the source of triggering transistor 208 which are both connected to the body of the active shunt transistor 125 and to VREF, in some embodiments, through a resistor. As discussed above, while in normal operation (i.e., no ESD stress event on I/O pad 52a), the output of the pull-down transistors 204-206 drives the gate of triggering transistor 208 LOW turning OFF the triggering transistor 208. Because the triggering transistor 208 is OFF, the active shunt resistor 125 will also be OFF, and thus, will not shunt current from the I/O pad 52a to VREF. However, as discussed above, the triggering transistor 208 is turned ON by the gate drive voltage provided by boot capacitor 202 upon occurrence of an ESD stress event on the I/O pad 52a. When triggering transistor 208 is ON, current is sourced into the body of active shunt transistor 125 enabling a low trigger voltage to turn the active shunt transistor 125 ON during an ESD stress event on the I/O pad 52a.

In the embodiment shown in FIG. 2, the drain of the active shunt transistor 125 is connected to the I/O pad 52a. The gate and source of the active shunt transistor 125 are connected to VREF. The body of active shunt transistor 125 is connected to the source and body of triggering transistor 208 and to VREF, in some embodiments, through a resistor. Thus, as discussed above, upon occurrence of an ESD stress event on the I/O pad 52a, the shunt transistor 125 turns ON with a low trigger voltage so as to shunt current from the I/O pad 52a to VREF.

In another embodiment not shown in FIG. 2 (when the ESD protection circuit 104 is utilized between two I/O pads (e.g., I/O pads 52a and 52b), the drain of shunt transistor 125 and the drain of the triggering transistor 208 are connected to one I/O pad (e.g., I/O pad 52a) while the source of shunt transistor 125 and the source of triggering transistor 208 are connected to the other I/O pad (e/g. I/O pad 52b). In this embodiment, the isolation n-well is connected to a third I/O pad (e.g., 52n) or the VDD pad. In yet another embodiment not shown in FIG. 2 (when the ESD protection circuit 104 is utilized between VDD and VREF), the drain of shunt transistor 125 and the drain of triggering transistor 208 are connected to the VDD pad and the source of shunt transistor 125 and the source of the triggering transistor 208 are connected to VREF. In this embodiment, the isolation n-well is connected to an I/O pad (e.g., I/O pad 52a).

Figure 3:
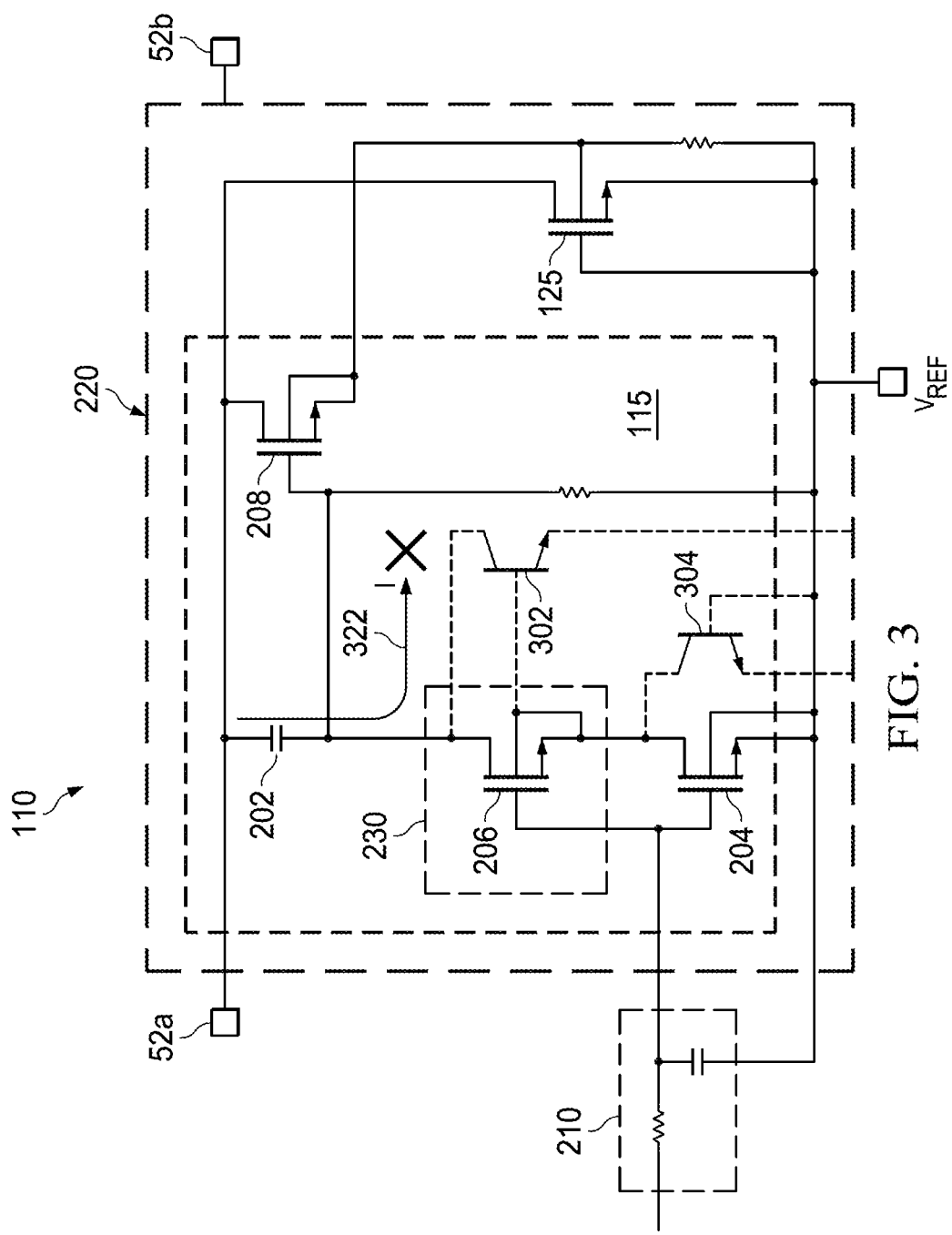
FIG. 3 shows an illustrative circuit diagram of an ESD protection circuit which provides ESD protection for an I/O pad during an ESD stress event that introduces parasitic structures in accordance with various embodiments.

FIG. 3 shows an illustrative circuit diagram of ESD protection circuit 110 which provides ESD protection for I/O pad 52a during an ESD stress event that introduces parasitic structures into the ESD protection circuit 110 in accordance with various embodiments. The components shown in FIG. 3 are the same as in FIG. 2 except that the components in FIG. 3 show the parasitic structures 302-304 that are formed in the ESD protection circuit 110 during an ESD stress event on the I/O pad 52a. For example, the ESD protection circuit 110 of FIG. 3 includes the boot capacitor 202, the pull-down transistors 204-206, the triggering transistor 208, and the active shunt transistor 125 with the same connections as shown in FIG. 2. Thus, the ESD protection circuit 110 shown in FIG. 3 performs in the same manner as the ESD protection circuit 110 shown in FIG. 2.

Upon occurrence of an ESD stress event between I/O pad 52a and I/O pad 52b or between I/O pad 52a and VDD, the parasitic NPN transistors 302-304 are formed. More particularly, the parasitic NPN transistor 304 is formed between the drain of the pull-down transistor 204 and the isolation n-well. Similarly, the parasitic NPN transistor 302 is formed between the drain of the pull-down transistor 206 and the isolation n-well. Without the parasitic transistor 302, the parasitic NPN 304 would be forward biased by current 322 flowing from I/O pad 52a through parasitic capacitors shunting around active shunt transistor 125 to VREF and then to I/O pad 52b, assuming I/O pad 52b is connected to the isolation n-well 220. Thus, without the parasitic NPN 302, the parasitic NPN 304 would discharge the gate of triggering transistor 208, disabling the triggering mechanism from turning the active shunt transistor 125 ON during the ESD stress event. However, because pull-down transistor 206 is in a separate isolation tank 230 from the pull-down transistor 204, triggering transistor 208, and active shunt transistor 125, the body of the pull-down transistor 206 is different from the bodies of the other transistors. Therefore, the base of parasitic NPN 302, which is formed during an ESD stress event in I/O pad 52a, will not be charged up easily. Thus, while the base of parasitic NPN 304 will be biased during an ESD stress event, current 322 will not flow through the parasitic NPN 304 because the parasitic NPN 302 will be turned OFF. Thus, the gate of triggering transistor 208 will not be discharged and the trigger mechanism for active shunt transistor 125 will work as described above.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electrostatic discharge (ESD) protection circuit, comprising:
   an active shunt transistor configured to be coupled between a first input/output (I/O) pad and a reference voltage;
   a first pull-down transistor including a gate and a source, wherein the source of the first pull-down transistor is configured to connect to the reference voltage; and
   a second pull-down transistor including a gate and a drain, wherein the gate of the second pull-down transistor is connected to the gate of the first-pull down transistor and the drain of the second pull-down transistor coupled to the first I/O pad;
wherein the first pull-down transistor and the second pull-down transistor are in separate isolation tanks of an isolation deep n-well.

2. The ESD protection circuit of claim 1, further comprising a triggering transistor including a gate, a source, and a drain, wherein the gate and the source of the triggering transistor are configured to connect to the reference voltage and the drain of the triggering transistor is connected to the first I/O pad.

3. The ESD protection circuit of claim 2, wherein the gate of the triggering transistor is connected to the drain of the second pull-down transistor.

4. The ESD protection circuit of claim 1, wherein the isolation deep n-well is connected to a second I/O pad.

5. The ESD protection circuit of claim 4, wherein upon occurrence of an ESD stress event on the first I/O pad, a first parasitic NPN transistor is formed by the first pull-down transistor and a second parasitic NPN transistor is formed by the second pull-down transistor.

6. The ESD protection circuit of claim 5, wherein the second parasitic NPN transistor is OFF during the ESD stress event.

7. The ESD protection circuit of claim 6, wherein current does not flow through the first parasitic NPN transistor during the ESD stress event.

8. The ESD protection circuit of claim 1, wherein a source of the second pull-down transistor is connected to a drain of the first pull-down transistor.

9. The ESD protection circuit of claim 1, wherein the active shunt transistor, the first pull-down transistor, and the second pull-down transistor are n-type metal oxide semiconductor (NMOS) transistors.

10. An integrated circuit, comprising:
a first input/output (I/O) pad and a second I/O pad, the first and second I/O pads connected to host logic and providing input and output connections for the host logic; and
an electrostatic discharge (ESD) protection circuit coupled to the first and second I/O pads, the ESD protection circuit including:
an active shunt transistor configured to be coupled between the first I/O pad and a reference voltage;
a first pull-down transistor connected to the reference voltage; and
a second pull-down transistor connected to the first pull-down transistor and the first I/O pad;
wherein the first pull-down transistor and the second pull-down transistor are in separate isolation tanks of an isolation deep n-well.

11. The integrated circuit of claim 10, wherein the ESD protection circuit further includes a triggering transistor configured to connect to the first I/O pad, the active shunt transistor, and the first pull-down transistor.

12. The integrated circuit of claim 11, wherein:
a gate of the triggering transistor is connected to a drain of the second pull-down transistor and the reference voltage through a resistor; and
a drain of the triggering transistor is connected to the first I/O pad.

13. The ESD protection circuit of claim 11, wherein the active shunt transistor, the first pull-down transistor, the second pull-down transistor, and the triggering transistor are n-type metal oxide semiconductor (NMOS) transistors.

14. The integrated circuit of claim 10, wherein:
a drain of the active shunt transistor is connected to the first I/O pad; and
a gate and a source of the active shunt transistor are connected to the reference voltage.

15. The integrated circuit of claim 10, wherein:
a gate of the first pull-down transistor is connected to a gate of the second pull-down transistor;
a drain of the first pull-down transistor is connected to a source of the second pull-down transistor;
a source of the first pull-down transistor is connected to the reference voltage; and
a drain of the second pull-down transistor is coupled to the first I/O pad.

16. The integrated circuit of claim 10, wherein upon occurrence of an ESD stress event on the first I/O pad, a first parasitic NPN transistor is formed by the first pull-down transistor and a second parasitic NPN transistor is formed by the second pull-down transistor.

17. The integrated circuit of claim 16, wherein the second parasitic NPN transistor is OFF during the ESD stress event.

18. The integrated circuit of claim 17, wherein current does not flow through the first parasitic NPN transistor during the ESD stress event.

19. An electrostatic discharge (ESD) protection circuit, comprising:
an active shunt transistor configured to be coupled between a first I/O pad and a reference voltage;
a first pull-down transistor connected to the reference voltage; and
a second pull-down transistor connected to the first pull-down transistor and the first I/O pad;
wherein the first pull-down transistor and the second pull-down transistor are in separate isolation tanks of an isolation deep n-well.

20. The ESD protection circuit of claim 19, further comprising a triggering transistor configured to connect to the first I/O pad, the active shunt transistor, and the first pull-down transistor.

* * * * *